METHOD OF FORMING A THERMOELECTRIC PANEL

Original Filed May 16, 1958

INVENTOR.

Mervin K. Baer, Jr.,

By Hofgren, Brady, Wegner, Allen & Stellman Att'ys.

United States Patent Office 3,264,714

Patented August 9, 1966

3,264,714
METHOD OF FORMING A THERMOELECTRIC PANEL

Mervin K. Baer, Jr., Sawyer, Mich., assignor to Whirlpool Corporation, a corporation of Delaware Original application May 16, 1958, Ser. No. 735,804. Divided and this application June 9, 1961, Ser. No. 116,187
1 Claim. (Cl. 29—155.5)

This is a division of application Serial No. 735,804 filed May 16, 1958, for a Refrigerating Apparatus, assigned to the assignee hereof, and now abandoned.

This invention relates to refrigerating apparatus, particularly a thermocouple structure employing dissimilar thermoelectric elements.

It has been proposed to use a plurality of dissimilar thermoelectric elements connected in electrical series to transfer thermal energy when the series is subjected to a direct current. In general, a pair of these dissimilar elements is used to make a thermocouple and one or more thermocouples are employed connected in electrical series. When a plurality of the thermocouples are used, the elements and the junctions adjoining them in electrical series are so arranged that the cold junctions are on one side of the structure and the hot junctions are on the other when the direct current is passed through the electrical series. In each thermocouple pair, one of the elements is identified as an N element which is one having an abundance of electrons. Bismuth is a good example of this type of material. The other elements is identified as a P element and is one having an abundance of electron vacancies. Antimony is a good example of the P type material.

In order for the thermocouple structure to operate, it is necessary that there be provided electrically secure joints connecting the elements to the junctions. These joints are often quite fragile and may be broken by too severe a shock.

One of the features of this invention is to provide an improved thermocouple structure comprising a thermoelectric element, an electrically conducting member, and an electrically secure joint interconnecting the element and the member.

Another feature of this invention is the provision of an improved method of forming a thermocouple panel wherein the electrically conducting member is formed over one end of the thermoelectric element as by plating or casting.

Other features and advantages of the invention will be apparent from the following description of certain embodiments thereof taken in conjunction with the accompanying drawings. Of the drawings.

Figures 1, 2:
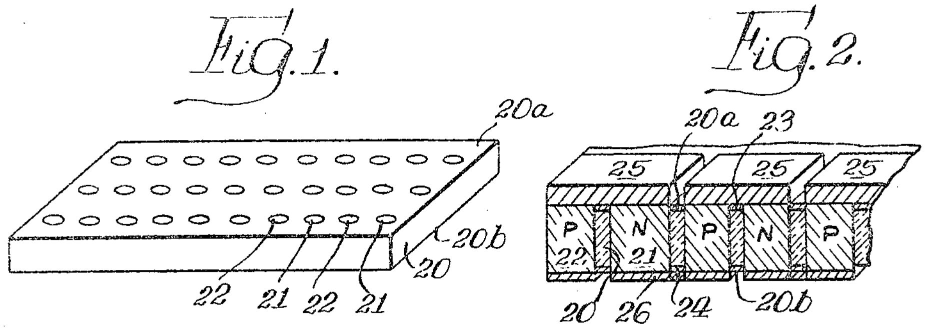
FIGURE 1 is a perspective view of a block of electrical insulating material.
FIGURE 2 is a fragmentary perspective view of a section of the completed thermoelectric panel embodying the invention using the insulating block of FIGURE 1.

In the embodiment shown in FIGURES 1 and 2 there is provided a block 20 of thermal and electrical insulating material having top and bottom surfaces 20*a* and 20*b* and containing spaced alternate thermoelectric elements 21 and 22 located in openings in the block 20. Each element has one end surface adjacent to a block surface 20*a* and the other end surface adjacent to the surface 20*b*. In producing the thermoelectric panel as shown in FIGURE 2, each surface 20*a* and 20*b* is provided with a thin sheet of metal such as copper 23 and 24. Each copper sheet is cut out to permit the ends of the elements 21 and 22 to extend therethrough. Then a continuous plate of copper is electroplated in the well-known manner on each of the thin copper sheets 23 and 24. Afterwards, the combined layers of copper sheet and copper plate are cut to form metal junctions 25 and 26. The junctions 25 and 26 connect the thermoelectric elements 21 and 22 in electrical series so that when the series is subjected to a thermoelectric current one set of junctions 25 or 26 becomes the cold junctions while the other set of junctions on the other side becomes the hot junctions.

In this embodiment, the electrically secure joints between the elements and the junctions are made without requiring heat. This is an important advantage as it is often difficult to obtain a secure joint by heat soldering or other heat attaching means. Furthermore, there is always danger that the heat will damage the element. In addition, the copper plating produces the metal for all junctions in a single operation requiring only that the copper layers be cut, etched or otherwise subdivided into the connecting junctions.

The block 20 of insulating material may have any shape desired. It may be produced and then cut to provide holes or openings for the insertion of the elements 21 and 22 or the block of material may be cast in liquid or other flowable form around the spaced elements and then hardened. The copper sheets 23 and 24 are not absolutely required as any type of electrically conducting layer desired may be used so long as it will permit the electroplated copper to be cast or deposited thereon.

In the embodiment shown herein the junctions are arranged on opposite sides of the panel so that the junctions on one side will be hot and those on the other cold when the panel is subjected to a thermoelectric current. The electrically conducting metal portions of each panel are preferably made of copper, aluminum or other readily conducting material. In the panels of this invention, the parts are assembled in a rigid, substantially strong unit and the electric joints at the surfaces of the elements are protected by reinforcing means such as the rigid block 20 of insulating material. This is accomplished by the block of insulating material which protects not only the joints but also the elements themselves. Thus, the panels are strong, sturdy, compact and provide protection for the electrical joints, and for the elements themselves.

The thermal and electrical insulating material may be any of the well-known plastics, preferably a foamed plastic that is substantially rigid and that preferably is foamed in place. Among the foamed plastics that may be used are foamed polystyrene, foamed polyurethane and the like. Because of its excellent physical properties and because it may be foamed in place to adhere firmly to the surfaces which it contacts to produce a rigid block, a foamed, rigid polyurethane is preferred. These are well-known and widely used materials and are easily produced. In general the foamed, rigid polyurethanes are produced by reacting an organic diisocyanate such as toluene 2,4-diisocyanate with a polyester of a dibasic acid and a trihydric alcohol in which the ester contains free hydroxy and carboxylic groups with the reaction taking place in the presence of water. Methods of producing such rigid polyurethane foams are disclosed, for example, in U.S. Patent 2,577,281 with Example 17 showing an excellent method of preparing such a rigid foam.

In a method disclosed in the above patent, an alkyd resin is first produced as by reacting 4 mols of glycerol and 2.5 mols of adipic acid in the presence of 0.5 mol of phthalic anhydride. This resin is the polyester. This resin is then reacted with the diisocyanate and preferably water as the foaming agent, also preferably in the presence of a nonionic wetting agent to promote more uniform cell formation. A catalyst such as benzoyl peroxide is also preferably included and if desired a flame retarding agent such as is disclosed in the patent.

Where the junctions are formed by plating or casting and the upper sheets 23 and 24 are omitted as disclosed above, the block 20 may be preformed to carry the junctions circumjacent the ends of the thermoelectric elements.

Having described our invention as related to the embodiments shown in the accompanying drawings, it is my intention that the invention be not limited by any of the details of description, unless otherwise specified, but rather be construed broadly within its spirit and scope as set out in the accompanying claim.

The embodiments of the invention in which an exclusive property or privilege is claimed are defined as follows:

The method of forming a thermoelectric panel, comprising the steps of: disposing a plurality of pairs of preformed thermoelectric elements in laterally spaced relationship in a support of insulating material having opposite surfaces, with an end portion of each element projecting outwardly from said surfaces; disposing on each of said opposite surfaces of the support a preformed metal sheet having a plurality of holes with said element ends projecting through said holes, said sheet having a thickness substantially equal to the amount of projection of said end portions from said opposite surfaces of said support; electroplating a layer of metal in situ over each sheet and end portions of each element to form an electrical and mechanical connection to said sheet and to said end portions of each element; and removing a portion of the integral metal sheet and layer to define a plurality of spaced metal junctions each connecting a pair of elements.

References Cited by the Examiner

UNITED STATES PATENTS

| | | | |
|---|---|---|---|
| 2,728,693 | 12/1955 | Cado | 204—38 X |
| 2,768,133 | 10/1956 | Lundbye | 204—38 X |
| 2,947,150 | 8/1960 | Roeder | 136—4 |

FOREIGN PATENTS

| | | |
|---|---|---|
| 838,738 | 4/1941 | France. |
| 587,490 | 4/1947 | Great Britain. |

OTHER REFERENCES

Modern Plastics, vol. 31, No. 8, April 1954, pp. 91–93.

Swiggett, R. L.: "How Etched Circuits Are Made" in "Modern Plastics," vol. 31, No. 8, April 1954, pp. 94 and 95.

WINSTON A. DOUGLAS, *Primary Examiner.*

JOHN H. MACK, *Examiner.*

J. BARNEY, A. M. BEKELMAN, *Assistant Examiners.*